United States Patent
Bhagavatheeswaran et al.

(10) Patent No.: US 8,324,882 B2
(45) Date of Patent: Dec. 4, 2012

(54) PHASE LOCKED LOOP DEVICE AND METHOD THEREOF

(75) Inventors: Gayathri A. Bhagavatheeswaran, Austin, TX (US); Lipeng Cao, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 543 days.

(21) Appl. No.: 12/480,311

(22) Filed: Jun. 8, 2009

(65) Prior Publication Data

US 2010/0308793 A1 Dec. 9, 2010

(51) Int. Cl.
*G01R 23/175* (2006.01)
(52) U.S. Cl. .................................. 324/76.54
(58) Field of Classification Search ............... 324/76.54
See application file for complete search history.

(56) References Cited

U.S. PATENT DOCUMENTS

| | | |
|---|---|---|
| 4,499,434 A | 2/1985 | Thompson |
| 4,771,249 A | 9/1988 | Burch et al. |
| 5,126,690 A | 6/1992 | Bui et al. |
| 5,724,007 A * | 3/1998 | Mar .............................. 331/1 A |
| 6,115,438 A | 9/2000 | Andresen |
| 6,522,122 B2 * | 2/2003 | Watanabe et al. .......... 324/76.77 |
| 6,528,982 B1 * | 3/2003 | Yanagisawa et al. ...... 324/76.77 |
| 2004/0152438 A1 | 8/2004 | Yamauchi et al. |
| 2005/0198247 A1 | 9/2005 | Perry et al. |
| 2007/0216462 A1 * | 9/2007 | Ishimi ............................. 327/291 |
| 2007/0222490 A1 * | 9/2007 | Choi ............................. 327/158 |
| 2008/0112524 A1 | 5/2008 | Paek et al. |
| 2009/0325494 A1 | 12/2009 | Staszewski et al. |
| 2010/0073054 A1 | 3/2010 | Bereza et al. |

OTHER PUBLICATIONS

Office Action mailed Aug. 1, 2012 in U.S. Appl. No. 12/480,344.

* cited by examiner

*Primary Examiner* — Jeff Natalini

(57) ABSTRACT

A phase locked loop device includes a phase detector that measures a difference in phase between a reference clock signal and an output clock signal of the phase locked loop. The phase detector provides a pulse having a width indicative of the phase difference. A phase measurement module determines a digital value based on the pulse width. Accordingly, the digital value provides an indication of the phase difference between the reference clock signal and the output clock signal. A series of the digital values can be recorded to indicate how the phase difference varies over time, thereby providing a useful characterization of device behavior.

13 Claims, 6 Drawing Sheets

PHASE LOCKED LOOP DEVICE AND METHOD THEREOF

CROSS-REFERENCE TO RELATED APPLICATION

The present application is related to U.S. patent application Ser. No. 12/480,344, entitled, "PHASE LOCKED LOOP DEVICE AND METHOD THEREOF" filed on an even date herewith, the entirety of which is incorporated by reference herein.

BACKGROUND

1. Field of the Disclosure

The present disclosure relates generally to electronic devices, and more particularly, to phase locked loop devices.

2. Description of the Related Art

Phase locked loop devices are used in a wide variety of electronic devices. For example, data processing devices typically employ one or more phase locked loops to generate clock signals based on a reference clock signal provided by a crystal oscillator. In some data processing devices, different phase locked loops are used to generate different clock signals for different modules of the device. For example, a data processing device with multiple processor cores can employ different phase locked loops to generate different clock signals for each processor core, and to generate clock signals for other device modules, such as a memory controller. However, the operation of a phase locked loop device can be adversely affected by power fluctuations and other transient noise signals, resulting in excessive phase error, jitter, drift, and other undesirable perturbations in the output of the phase locked loop. Such perturbations can cause undesirable behavior in modules that use the output of the phase locked loop to synchronize their operations.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-8 illustrate a phase locked loop device having a phase detector that measures a difference in phase between a reference clock signal and an output clock signal of the phase locked loop. The phase detector provides a pulse having a width indicative of the phase difference. A phase measurement module determines a digital value based on the pulse width. Accordingly, the digital value provides an indication of the phase difference between the reference clock signal and the output clock signal. A series of the digital values can be recorded to indicate how the phase difference varies over time, thereby providing a useful characterization of device behavior.

Figure 1:
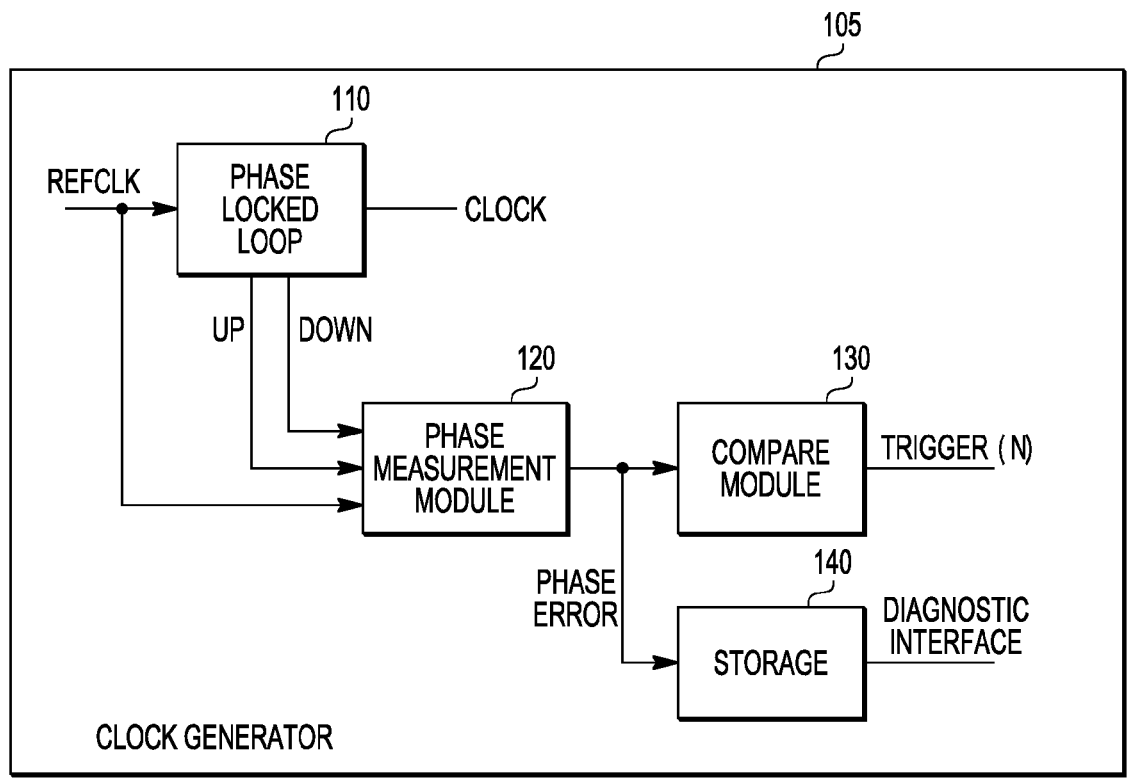
FIG. 1 is a block diagram illustrating an electronic device including a clock generator in accordance with a specific embodiment of the present disclosure.

FIG. 1 is a block diagram illustrating an electronic device 100 including a clock generator 105 in accordance with a specific embodiment of the present disclosure. Clock generator 105 includes a phase locked loop 110, a phase measurement module 120, a compare module 130, and a storage module 140. Phase locked loop 110 has an input to receive a clock signal labeled "REFCLK," an output to provide clock signal labeled "CLOCK," an output connected to phase measurement module 120 to provide a signal labeled "UP," and an output connected to phase measurement module 120 to provide a signal labeled "DOWN." Phase measurement module 120 has an input to receive clock signal REFCLK, an output connected to compare module 130 and to storage module 140 to provide a digital signal labeled "PHASE ERROR." Compare module 130 has an output to provide a signal labeled "TRIGGER(N)." Storage module 140 has an output to provide a signal labeled "DIAGNOSTIC INTERFACE."

Phase locked loop 110 is configured to generate clock signal CLOCK having a frequency and phase based on the signal REFCLK. In particular, phase locked loop 110 is configured to regulate the frequency and phase of clock signal CLOCK so that the phase and frequency remain within defined parameters. Phase locked loop 110 is further configured to generate signals UP and DOWN based on the instantaneous phase difference between the signal REFCLK and the signal CLOCK. In an embodiment, phase locked loop 110 is configured to communicate a pulse via signal UP when the phase of clock signal REFCLK and the phase of clock signal CLOCK differ within a first defined range, and to communicate a pulse via signal DOWN when the phase of clock signal REFCLK and the phase of clock signal CLOCK differ within a second defined range different from the first. For example, in one embodiment phase locked loop 110 is configured to communicate a pulse via signal UP when the phase of clock signal REFCLK and the phase of clock signal CLOCK differ from between about 0 and about 180 degrees, and is configured to communicate a pulse via signal UP when the phase of clock signal REFCLK and the phase of clock signal CLOCK differ from between about 181 and about 360 degrees. The pulse width of the pulse communicated via signal UP or signal DOWN is indicative of a phase error between clock signals REFCLK and CLOCK. The operation of phase locked loop 110 is described in detail later with reference to FIGS. 2 and 3.

Phase measurement module 120 is configured to measure the pulse width of a pulse communicated via signal UP or signal DOWN, and provide a digital value based on the measured pulse width via signal PHASE ERROR. The operation of phase measurement module is described in detail with reference to FIG. 4.

Compare module 130 is configured to assert one or more trigger signals based on phase error information provided by signal PHASE ERROR and programmed information specifying phase error thresholds. For example, compare module 130 can assert a trigger signal when a phase error exceeds a programmed threshold limit or when a phase error exceeds a threshold limit for a programmed amount of time. As described further herein with respect to FIG. 7, respective trigger signals can be associated with particular phase error thresholds and durations based on a corresponding performance requirement of associated modules at electronic device 100. The operation of compare module 130 is described in detail with reference to FIGS. 6-8.

Storage module 140 is configured to record successive values of signal PHASE ERROR and to provide this information via signal DIAGNOSTIC INTERFACE to operation analysis devices (not shown) or diagnostic modules (not shown) included at electronic device 100. For example, pairs of successive phase error values can be used by a diagnostic module to determine a cycle-by-cycle phase jitter. A large number of samples of phase error information can be used to determine an average phase error, to prepare a jitter histogram, or to analyze drift and time interval error (TIE) of phase locked loop 110. Furthermore, stored phased error information can be analyzed by a diagnostic module to correlate a device fault with a specific cycle of clock signal CLOCK that is associated with a particular magnitude of phase error. Digital phase error information maintained at storage module 140 can be accessed via program-accessible registers, via an automated test equipment interface such as a Joint Test Action Group (JTAG) interface, or by another interface protocol. Furthermore, information specifying the number of samples stored at storage module 140, as well as information specifying when to collect the samples, can be configured via the diagnostic interface. Thus, phase error information can be stored and analyzed at any time, such as during normal operation of electronic device 100, during manufacture testing of electronic device 100, or during system platform validation testing of equipment including electronic device 100.

In operation, phase locked loop 110 periodically or continuously measures the difference between its frequency and phase and that of the signal CLOCK. Based on the frequency and phase difference, phase locked loop 110 adjusts the frequency of the signal CLOCK. Via this periodic or continuous adjustment, phase locked loop 110 ensures the phase and frequency of signal CLOCK remains within specified parameters.

In addition, based on each measured phase difference between the signals REFCLK and CLOCK, phase locked loop 110 communicates a pulse via one of the signals UP and DOWN. In an embodiment, phase locked loop 110 measures the phase difference, and provides a pulse for each cycle of the signal REFCLK. Phase measurement module 120 measures the width of a received pulse and, based on the pulse width, provides a digital value via the signal PHASE ERROR. Thus, signal PHASE ERROR provides an ongoing stream of digital values indicative of phase difference information corresponding to cycles of clock signal REFCLK. In an embodiment, a digital value for the phase difference is determined and provided for every other cycle of clock signal REFCLK. This ensures that, in the event of large phase errors, erroneous digital values are not provided.

Compare module 130 compares each digital values received via the signal PHASE ERROR to one or more thresholds and, based on the comparison, assert one or more bits of the signal TRIGGER(N). Accordingly, asserted bits of the trigger signal TRIGGER(N) provide an indication of that the difference in phase between the signal REFCLK and the signal CLOCK exceeds a threshold associated with the asserted bit. As described further herein, the asserted bits can be used to trigger a response to the phase difference exceeding the associated threshold, allowing electronic device 100 to take appropriate remedial action. For example, if one of the bits of the signal TRIGGER(N) indicates the phase difference at phase locked loop 110 exceeds a programmed threshold, electronic device 100 can select an alternate clock source for one or more modules of the device.

In addition, the phase error information communicated via the signal PHASE ERROR can be used to provide diagnostic insight into failures or anomalous behavior at electronic device 100. For example, a high rate of error correction activity at a synchronous interface receiver might be traced to excessive phase error at a clock generator included at electronic device 100. In turn, the phase error information may be correlated with voltage droop related to poor power distribution at a printed circuit board associated with electronic device 100. Thus, phase error information can be useful for diagnosing the cause of failures at electronic device 100.

Figure 2:
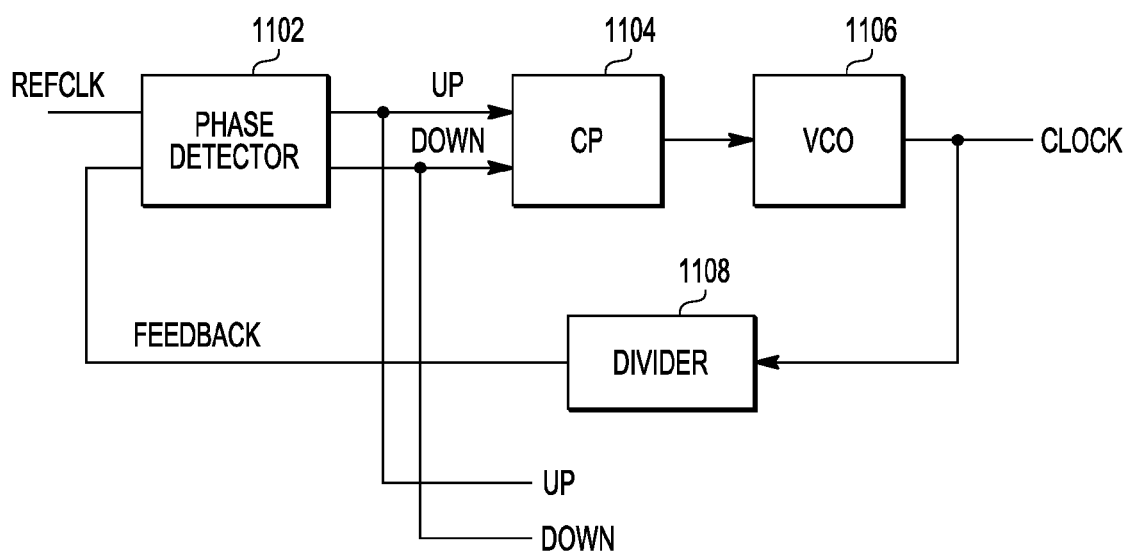
FIG. 2 is a block diagram illustrating the phase locked loop of FIG. 1 in accordance with a specific embodiment of the present disclosure.

FIG. 2 is a block diagram illustrating phase locked loop 110 of FIG. 1 in accordance with a specific embodiment of the present disclosure. Phase locked loop 110 includes a phase detector 1102, a charge pump 1104, a voltage controlled oscillator (VCO) 1106, and a divider 1108. Phase detector 1102 has an input to receive signal REFCLK, another input connected to an output of divider 1108 to receive a clock signal labeled "FEEDBACK," an output connected to charge pump 1104 to provide signal UP, and an output connected to low pass filter 1104 to provide signal DOWN. Charge pump 1104 has an output connected to VCO 1106, and VCO 1106 has an output to provide clock signal CLOCK, which is also connected to an input of divider 1108.

Phase detector 1102 can include either a proportional phase detector, a bang-bang phase detector, or the like. Phase detector 1102 is configured to provide signal UP and signal DOWN based on a comparison of a phase difference between clock signal REFCLK and clock signal FEEDBACK. For example, phase detector 1102 asserts signal UP if the phase (or frequency) of clock signal FEEDBACK lags that of clock signal REFCLK, and asserts signal DOWN if the phase relationship is reversed. Signal UP and signal DOWN are pulses, and the duration of each pulse is dependent on the phase error between clock signal REFCLK and clock signal FEEDBACK. In an embodiment, signal UP and signal DOWN are mutually exclusive of each other. The operation of phase detector 1102 can be better understood with reference to FIG. 3.

Figure 3:
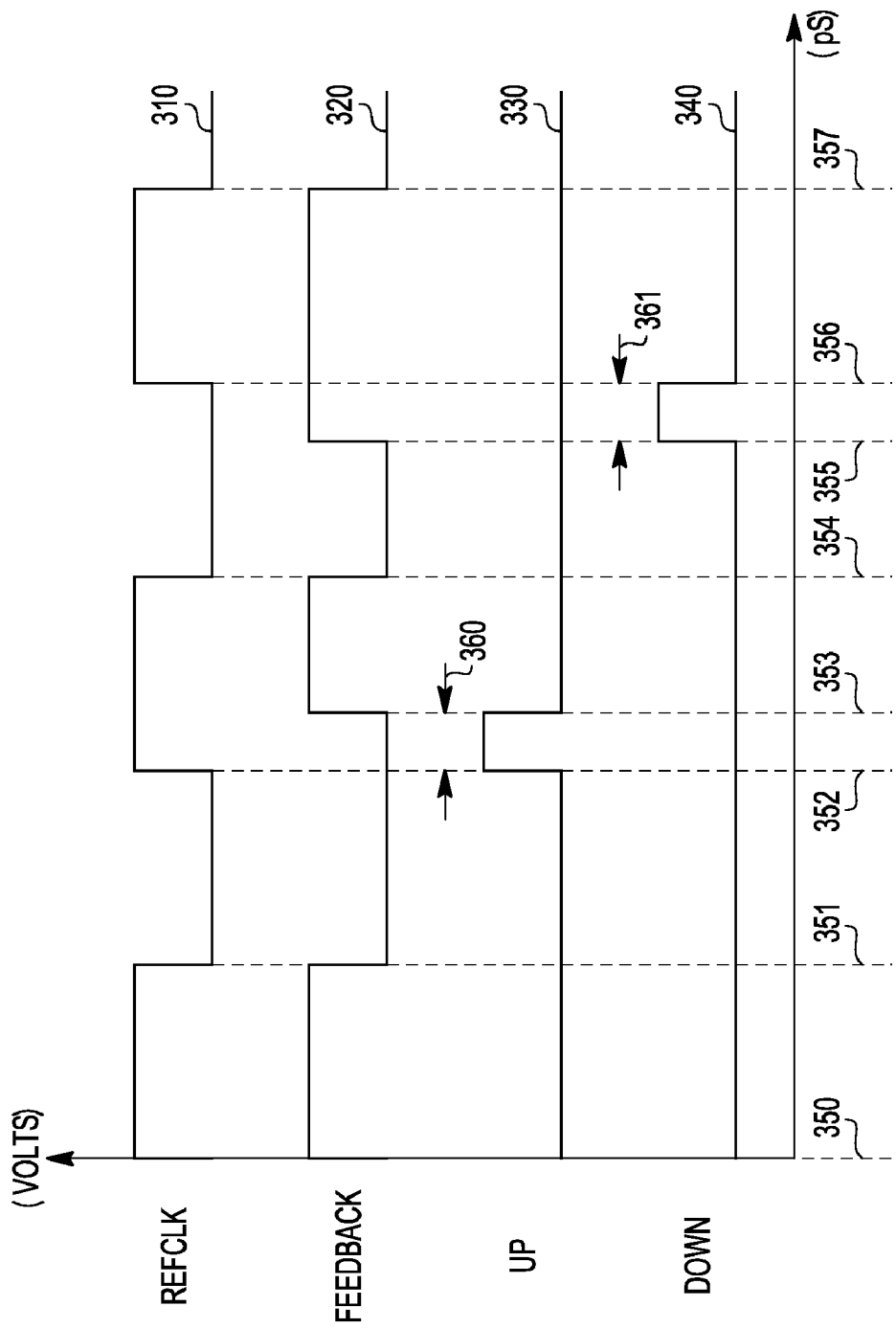
FIG. 3 is a timing diagram illustrating the operation of the phase detector at the phase locked loop of FIG. 2 in accordance with a specific embodiment of the present disclosure.

FIG. 3 is a timing diagram 300 illustrating the operation of phase detector 1102 of phase locked loop 110 at FIG. 2 in accordance with a specific embodiment of the present disclosure. Timing diagram 300 includes a horizontal axis representing time, and a vertical axis representing voltage. Timing diagram 300 illustrates a waveform 310 representing clock signal REFCLK, a waveform 320 representing clock signal FEEDBACK, a waveform 330 representing signal UP, a waveform 340 representing signal DOWN, time references 350, 351, 352, 353, 354, 355, 356, and 357, and intervals 360 and 361.

As illustrated by waveform 310, signal REFCLK transitions from a logic-low level to a logic-high level at time reference 350. As shown by waveform 320, signal FEEDBACK also transitions from a logic-low level to a logic-high level at time reference 350. Accordingly, at time 350 the clock signals REFCLK and CLOCK are in phase, and no pulse is provided via signals UP and DOWN. At time reference 352, the signal REFCLK transitions from a logic low to logic-high level, while signal CLOCK remains at a logic-low level until time reference 353. Accordingly, phase detector 1102 asserts signal UP during interval 360 at time reference 352 based on signal REFCLK transitioning to a logic-high level while clock signal FEEDBACK remains at a logic-low level. Signal UP is subsequently negated at time reference 353 based on a logic-low to logic-high transition of clock signal FEEDBACK. The pulse width of signal UP is thus indicative of the phase difference between signal REFCLK and signal FEEDBACK.

Similarly, at time reference 355 the signal FEEDBACK is asserted while the signal REFCLK remains negated until time reference 356. Accordingly, phase detector 1102 asserts signal DOWN during interval 361 in response to determining that clock signal FEEDBACK is leading clock signal REFCLK. Signal DOWN is subsequently negated at time reference 356 based on a logic-low to logic-high transition of clock signal REFCLK. The pulse width of signal UP is thus indicative of the phase difference between signal REFCLK and signal FEEDBACK. In an embodiment, the pulse width of signal UP and signal DOWN can range from substantially zero pico-seconds (pS) up to a period substantially equal to the period of clock signal REFCLK.

Referring again to FIG. 2, charge pump 1104 is configured to provide a control voltage to VCO 1106 based on signal UP and signal DOWN. For example, in response to the assertion of signal UP, charge pump 1104 increases the level of the control voltage provided to VCO 1106, which has the effect of advancing the phase of clock signal CLOCK generated by VCO 1106. Similarly, in response to the assertion of signal DOWN, charge pump 1104 decreases the level of the control voltage provided to VCO 1106, which has the effect of retarding the phase of clock signal CLOCK generated by VCO 1106. Thus, phase locked loop device 110 adjusts the frequency of clock signal CLOCK, corresponding to each cycle of clock signal REFCLK, based on a phase error determined by phase detector 1102.

Divider 1108 is configured to divide the frequency of clock signal CLOCK by an integer value N. Because phase detector 1102 is configured to adjust the operation of phase locked loop device 110 until the frequency and phase of clock signal REFCLK and clock signal FEEDBACK are substantially equal, VCO 1106 will generate clock signal CLOCK with a frequency that is an integer value N multiple of the frequency of clock signal REFCLK. As previously mentioned, divider 1108 may not be included at phase locked loop device 110. For example, clock signal CLOCK may represent a clock signal downstream of a clock distribution network (not shown at FIG. 2), and phase locked loop device 110 is configured to adjust the phase of a time-delayed clock signal CLOCK to be substantially equal to that of clock signal REFCLK.

Figure 4:
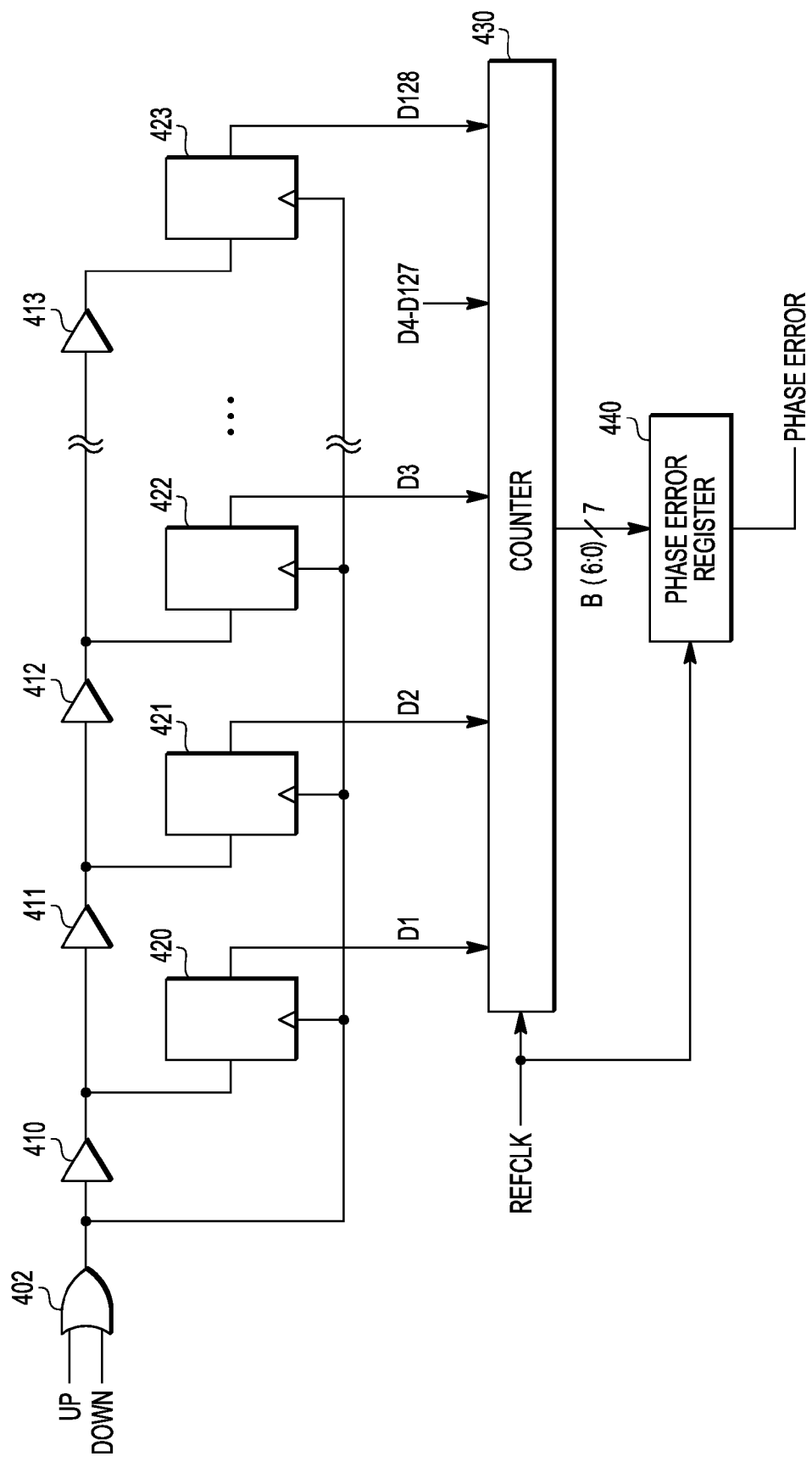
FIG. 4 is a block diagram illustrating the phase measurement module of FIG. 1 in accordance with a specific embodiment of the present disclosure.

FIG. 4 is a block diagram illustrating phase measurement module 120 of FIG. 1 in accordance with a specific embodiment of the present disclosure. Phase measurement module 120 is configured to provide a digital value representative of a phase difference between clock signal CLOCK and clock signal FEEDBACK. The digital value represented by signal PHASE ERROR is provided by phase measurement module 120 corresponding to every other cycle of clock signal REFCLK.

Phase measurement module 120 includes an OR gate 402, 128 delay elements including delay elements 410, 411, 412, and 413, 128 latches including latches 420, 421, 422, and 423, a counter 430, and a phase error register 440. OR gate 402 has an input to receive signal UP, another input to receive signal DOWN, and an output to provide a signal labeled "PULSE," which is connected to an input of delay element 410, and to a clock input at each of the latches, including latches 420-423. Delay element 410 has an output connected an input of delay element 411 and a data input of latch 420. Delay element 411 has an output connected an input of delay element 412 and a data input of latch 421. Delay element 412 has an output connected an input of a subsequent delay element (not shown) and a data input of latch 422. Delay element 413 has an input connected to an output of a prior delay element (not shown) and an output connected to a data input of latch 423.

Each of the 128 respective latches has an output connected to a corresponding input at counter 430. For example, latch 420 has an output connected to counter 430 to provide a signal labeled "D1," latch 421 has an output connected to counter 430 to provide a signal labeled "D2," latch 422 has an output connected to counter 430 to provide a signal labeled "D3," and latch 423 has an output connected to counter 430 to provide a signal labeled "D128." Additional latches (not shown) provide signals D4-D127 to counter 430 based on information stored at the corresponding latches. Counter 430 has another input to receive clock signal REFCLK, and an output to provide a seven-bit binary-encoded signal to phase error register 440. Phase error register 440 has another input to receive clock signal REFCLK and an output to provide signal PHASE ERROR.

OR gate 402 is configured to provide signal PULSE throughout the duration of an assertion of either signal UP or signal DOWN. Thus, the pulse width of signal PULSE is representative of either a lagging phase error or a leading phase error, as determined by phase detector 1102. In another embodiment, individual phase measurement modules can be associated with each of signal UP and signal DOWN.

Each of the delay elements, including delay elements 410-413, is configured to provide a signal propagation delay of approximately fifteen picoseconds (PS). In operation, signal PULSE is propagated sequentially from one delay element to the next in the series connected chain of delay elements. For example, a signal provided at the output of delay element 410 is a pulse with a pulse width approximately equal to that of signal PULSE, but wherein the rising and falling edges are delayed by approximately 15 pS. In a similar manner, a pulse provided at the output of delay element 411 is a pulse with a pulse width approximately equal to that of signal PULSE, but wherein the rising and falling edges are delayed by approximately 30 pS. Signal PULSE is delayed in this manner by each of the 128 series-connected delay elements, so that a pulse provided at the output of delay element 413 is a pulse with a pulse width approximately equal to that of signal PULSE, but wherein the rising and falling edges are delayed by approximately 1920 pS.

Each of the 128 latches, including latches 420-423, receive signal PULSE at the latches clock input. Each respective latch receives a unique one of the 128 signals provided at an output of an associated delay element at a corresponding latch data input. Thus, each of the 128 latches samples their respective input during the duration of the assertion of signal PULSE, and latches the value of the respective input in response to a falling transition of signal PULSE. The value latched at each of the 128 latches is represented by a corresponding one of signals D1-D128 provided at the respective output of each latch, including illustrated latches 420-423. Therefore, the number of signals that are asserted, of signals D1-D128, is representative of the pulse width of signal PULSE. For example, if the pulse width of signal PULSE is 10 pS, none of signals D1-D128 is asserted. If the pulse width of signal PULSE is 20 pS, only signal D1 is asserted. If the pulse width of signal PULSE is 35 pS, both of signals D1 and D2 are asserted. If the pulse width of signal PULSE is 2000 pS, each and all of signals D1-D128 are asserted. Thus, each successive signal of signals D1-D128 represent an indication of the pulse width of signal PULSE over a range of 15 pS to 1920 pS, and with a resolution of 15 pS.

Signals D1-D128 are received at counter 430, and together can be referred to as a temperature-encoded representation of the pulse width of signal PULSE, wherein each of signals D1-D128 represents a bit of a digital value. In an embodiment, the counter 430 is configured to is configured to latch the pulse width information provided by signals D1-D128 for alternating cycles of clock signal REFCLK. In this configuration, errors resulting from the pulse width of signal PULSE exceeding the pulse width of signal PULSE are reduced. Counter 430 decodes the temperature-encoded pulse width information into a binary-encoded representation of the pulse width of signal PULSE. In an embodiment, the temperature-encoded digital information is decoded into a binary-encoded digital value by counting the number of leading negated bits of a concatenated array of signals D128-D0. The following table illustrates an example of the re-encoding of the pulse width information performed by counter 430:

| Temperature-encoded D128-D0 | Binary encoded B (6:0) |
| --- | --- |
| 00000000000000000000...0001 | 0000001 |
| 00000000000000000000...0111 | 0000011 |
| 000000000000000...011111111 | 0001000 |
| 111111111111...11111111111 | 1111111 |

Thus, each pulse width represented by a 128-bit temperature-encoded value can be represented by a seven-bit binary-encoded value. In another embodiment, counter 430 can re-encode the temperature-encoded pulse width information into a binary-encoded representation by counting the number of trailing asserted bits of a concatenated array of signals D128-D0.

It will be appreciated that counter 120 can be implemented using a different number of delay elements and latches, and that the delay elements can provide a different propagation delay. For example, sixteen delay elements that each provides a propagation delay of 100 pS can be associated with sixteen latches, and would provide measurement of a pulse width of up to approximately 1600 pS and with a granular resolution of 100 pS. Thus, the granularity of measured values, and the total representable duration of signal PULSE can be configured based on particular requirements of clock generator 105 and electronic device 100.

Phase error register 440 is configured to latch the binary-encoded digital representation of the pulse width of the combination of phase error information provided by signal UP and signal DOWN. The digital phase error information represented by signal PHASE ERROR is provided to compare module 130 and to storage module 140.

Figure 5:
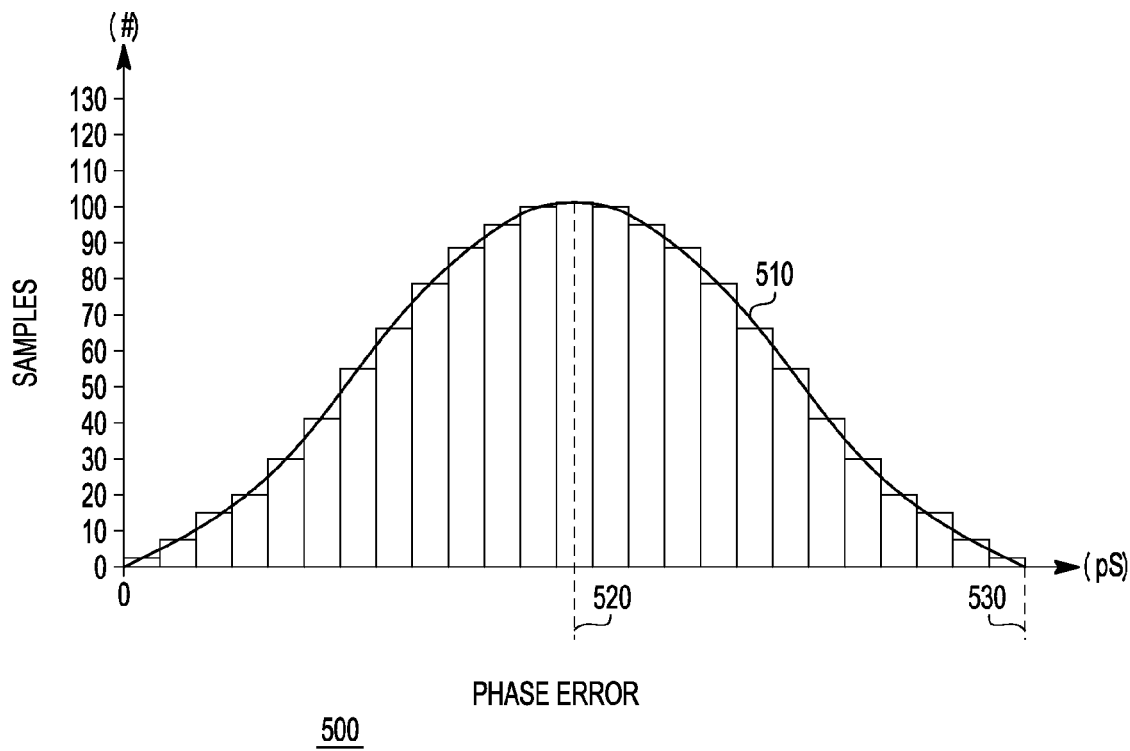
FIG. 5 is a histogram illustrating a collection of phase error information maintained at the storage module of FIG. 1 in accordance with a specific embodiment of the present disclosure.

FIG. 5 is a histogram 500 illustrating a collection of phase error information maintained at storage module 140 of FIG. 1 in accordance with a specific embodiment of the present disclosure. Histogram 500 includes a horizontal axis representing phase error, and a vertical axis representing a number of phase error samples. Histogram 500 also includes a curve 510 and time references 520 and 530. Curve 510 represents a number of phase error samples stored at storage module 140 corresponding to a particular amount of phase error. Histogram 500 can be referred to as a jitter histogram. For example, phase measurement module 120 is operable to provide a digital representation of the phase error between clock signal REFCLK and clock signal FEEDBACK. The phase error information associated with successive clock cycles can be stored at storage module 140. Histogram 500 illustrates a collection of approximately 1500 phase error samples. Phase error information stored at storage module 140 can be analyzed to determine a median phase error, represented by time reference 520, a maximum phase error, represented by time reference 530. Similar analysis can be periodically repeated to determine phase drift behavior of clock generator 105. A fewer or a greater number of samples available at storage module 140 can be represented at histogram 500.

Figure 6:
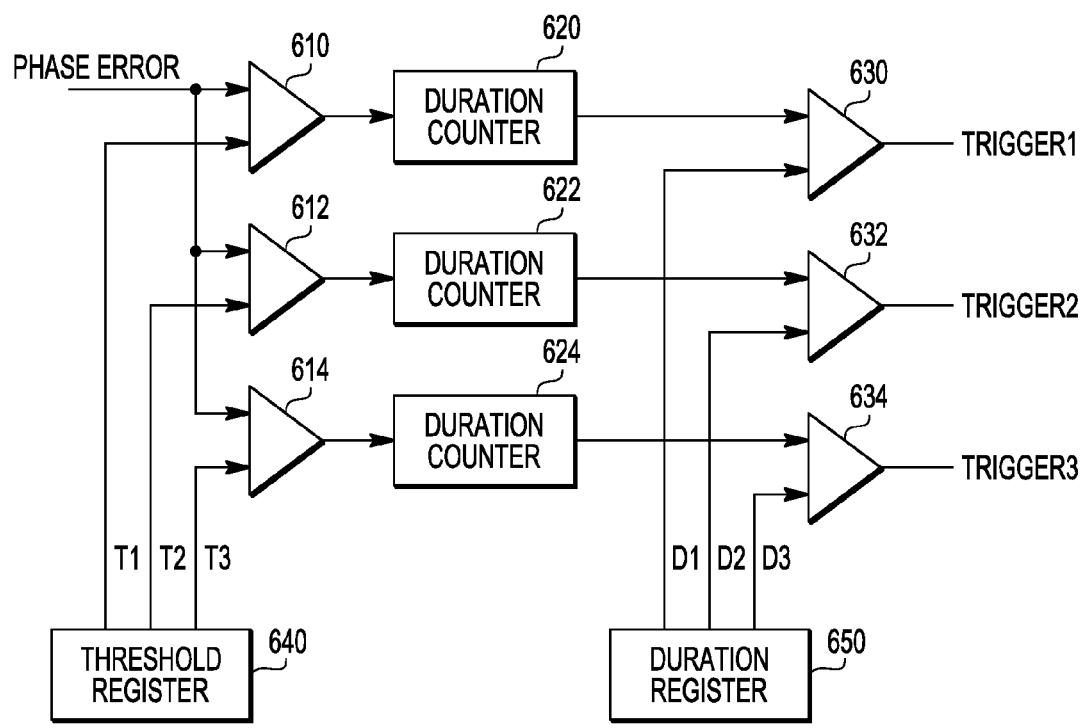
FIG. 6 is a block diagram illustrating the compare module of FIG. 1 in accordance with a specific embodiment of the present disclosure.

FIG. 6 is a block diagram illustrating compare module 130 of FIG. 1 in accordance with a specific embodiment of the present disclosure. Compare module 130 is configured to assert one or more trigger signals based on phase error information provided by signal PHASE ERROR and programmed information specifying phase error thresholds and phase error durations. Compare module 130 includes comparators 610, 612, 614, 630, 632, and 634, duration counters 620, 622, and 624, a threshold register 640, and a duration register 650.

Comparator 610 has an input to receive signal PHASE ERROR, an input to receive a signal labeled "T1" from threshold register 640, and an output connected to duration counter 620. Comparator 612 has an input to receive signal PHASE ERROR, an input to receive a signal labeled "T2" from threshold register 640, and an output connected to duration counter 622. Comparator 614 has an input to receive signal PHASE ERROR, an input to receive a signal labeled "T3" from threshold register 640, and an output connected to duration counter 624. Duration counter 620 has an output connected to comparator 630. Duration counter 622 has an output connected to comparator 632. Duration counter 624 has an output connected to comparator 634. Comparator 630 has another input to receive a signal labeled "D1" from duration register 650 and an output to provide a signal labeled "TRIGGER1." Comparator 632 has another input to receive a signal labeled "D2" from duration register 650 and an output to provide a signal labeled "TRIGGER2." Comparator 634 has another input to receive a signal labeled "D3" from duration register 650 and an output to provide a signal labeled "TRIGGER3."

Threshold register 640 is configured to store three programmable values representing phase error thresholds. Each of the programmed values, represented by signals T1, T2, and T3, is provided to a corresponding comparator of comparators 620, 622, and 624. During operation, a signal at the output of comparator 610 is asserted in the event that a phase error represented by signal PHASE ERROR exceeds a programmed threshold specified by signal T1. In a similar manner, a signal at the output of comparator 612 is asserted in the event that a phase error represented by signal PHASE ERROR exceeds the programmed threshold specified by signal T2, and a signal at the output of comparator 614 is asserted in the event that a phase error represented by signal PHASE ERROR exceeds the programmed threshold specified by signal T3.

Each of duration counters 620, 622, and 624 is configured to determine how long a corresponding phase error has exceeded the respective programmed threshold. During operation, duration counter 620 determines how long an assertion of a signal at the output of comparator 610 is maintained. In a similar manner, duration counter 622 determines how long an assertion of a signal at the output of comparator 612 is maintained, and duration counter 624 determines how long an assertion of a signal at the output of comparator 614 is maintained. For example, duration counter 620 provides at its output an indication of how long a phase error represented by signal PHASE ERROR exceeds a threshold specified by programmable value T1. In an embodiment, the length of time that a phase error threshold is exceeded is expressed as a number of cycles of clock signal REFCLK. In another embodiment, the length of time that a phase error threshold is exceeded is expressed in units of time, e.g. PS.

Threshold register 640 is configured to store three programmable values representing phase error thresholds. Each of the programmed values, represented by signals T1, T2, and T3, is provided to a corresponding comparator of comparators 620, 622, and 624. During operation, signal TRIGGER1 is asserted in the event that a phase error represented by signal PHASE ERROR exceeds a programmed threshold specified by signal T1. In a similar manner, signal TRIGGER2 is asserted in the event that a phase error represented by signal PHASE ERROR exceeds the programmed threshold specified by signal T2, and signal TRIGGER3 is asserted in the event that a phase error represented by signal PHASE ERROR exceeds the programmed threshold specified by signal T3.

Whereas compare module 130 at FIG. 6 is configured to provide three trigger signals based on three programmable threshold values and three corresponding duration values, another number of trigger signals can be included at compare module 130. Furthermore, a lesser or a greater number of threshold values and duration values can be provided by threshold register 640 and duration register 650, respectively, and the number of threshold values can be different than the number of duration values. For example, in an embodiment, a single threshold value can be provided by threshold register 640 to a single threshold comparator, e.g. comparator 610, and a signal at the output of duration counter 620 can be provided to each of comparators 630, 632, and 634. Thus, signal TRIGGER1 is asserted in response to a phase error in excess of a value represented by signal T1 and that remains at that level for a duration specified by signal D1. In a similar manner, TRIGGER2 is asserted in response to a phase error in excess of the value represented by signal T1 and that remains at that level for a duration specified by signal D2, and TRIGGER3 is asserted in response to a phase error in excess of the value represented by signal T1 and that remains at that level for a duration specified by signal D3.

Figure 7:
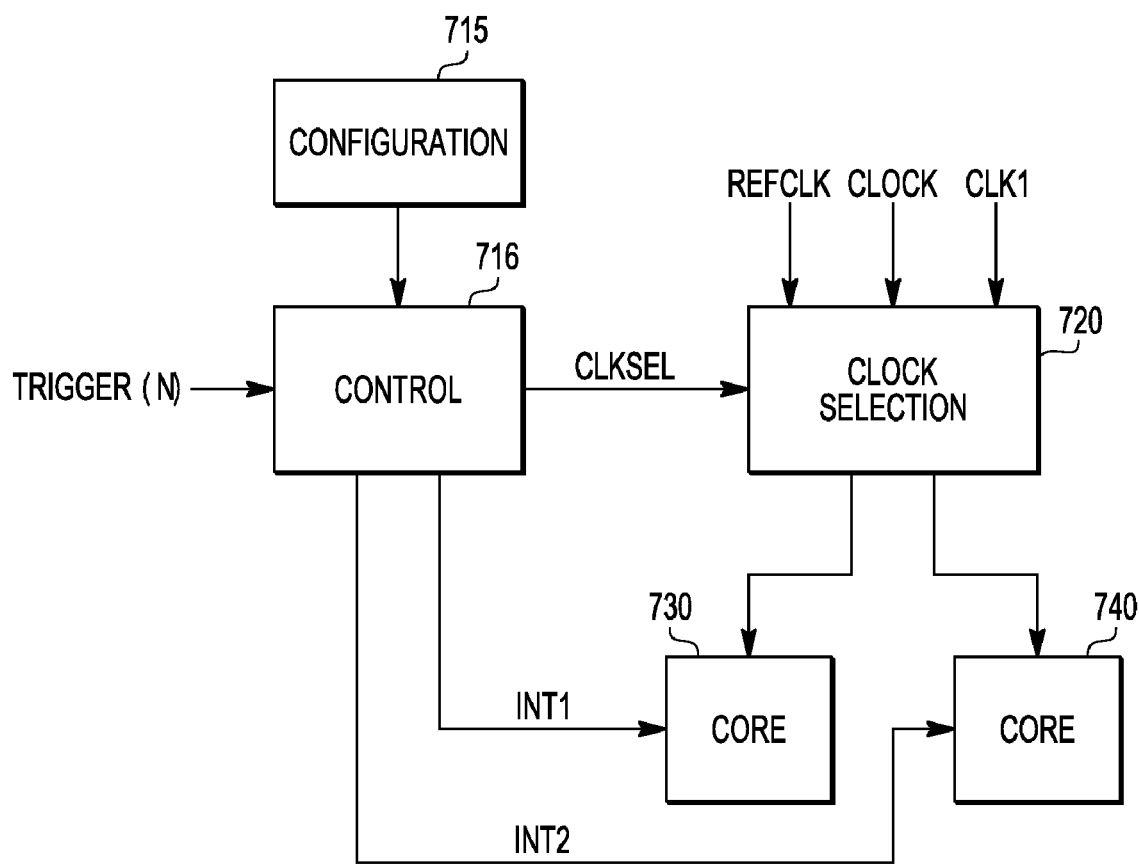
FIG. 7 is a block diagram illustrating further details of the electronic device of FIG. 1 in accordance with a specific embodiment of the present disclosure.

FIG. 7 is a block diagram illustrating further details of electronic device 100 of FIG. 1 in accordance with a specific embodiment of the present disclosure. Electronic device 100 includes a control module 710, a configuration module 715, a clock selection module 720, a processor core 730 and a processor core 740. Control module 710 has in input to receive signal TRIGGER(N), an input connected to configuration module 715, an output connected to clock selection module 720 to provide a signal labeled "CLKSEL," an output connected to processor core 730 to provide an interrupt signal labeled "INT1," and an output connected to processor core 740 to provide an interrupt signal labeled "INT2." Clock selection module 720 has an input to receive signal REFCLK, an input to receive signal CLOCK from clock generator 105 of FIG. 1, an input to receive a signal labeled "CLK2," an output to provide a clock signal to processor core 730, and an output to provide a clock signal to processor core 740.

Control module 710 is configured to control clock selection module 720 and interrupt signals provided to each of processor cores 730 and 740 based on information provided by signal TRIGGER(N) received from compare module 130 of FIG. 1 and programmable information received from configuration module 715. Control module 710 is operable to modify a configuration of electronic device 100 in response to determining that a functional failure has occurred, or to reconfigure the operation of electronic device 100 based on phase error information in order to prevent a functional failure. Clock selection module 720 is configured to provide one of multiple clock signals to each of processor cores 730 and 740.

For the purpose of example, processor core 730 is configured by clock selection module 720 to receive clock signal CLOCK, which is provided by clock generator 105 of FIG. 1. Compare module 130 (FIG. 1) can be configured to assert signal TRIGGER1 if phase measurement module 120 determines that a phase error at phase locked loop 110 has occurred, and that the phase error exceeds a desired level. Control module 710 can be configured by configuration module 715 to select an alternate clock source for processor core 730 in response to assertion of signal TRIGGER1. For example, control module 710 can configure clock selection module 720 via signal CLKSEL to provide clock signal REFCLK to processor core 730 instead of clock signal CLOCK. Thus, a functional failure at processor core 730 can be averted by detecting anomalous circuit behavior at clock generator 105 before a phase error exceeds a critical level at which a functional failure can occur.

Continuing with the previous example, compare module 130 can be configured to assert signal TRIGGER2 if phase measurement module 120 determines that a phase error at phase locked loop 110 has occurred, and the phase error exceeds a critical level associated with functional failures at processor core 740. Select module 710 can respond to the assertion of signal TRIGGER2 by asserting interrupt signal INT2, which directs processor core to perform an interrupt trap routine in order to reestablish correct functional operation.

Electronic device 100 can include multiple clock generators, and each clock generator can include associated phase measurement and compare modules, and provide corresponding trigger signals to control module 710. Phase error threshold and duration information programmed at respective compare modules can be configured based on the individual operating requirements of functional blocks or processor cores at electronic device 100. For example, a memory controller may require relatively stringent control of clock signal phase error, and trigger threshold and duration parameters can be configured accordingly. Conversely, a functional block operating at a lower frequency may be tolerant of greater clock signal phase error, and trigger threshold and duration parameters can be configured to assert a trigger signal at a relatively higher level of phase error.

In an embodiment, clock signals received at clock selection module 720 can include clock signals operating at disparate frequencies. Under normal operating conditions, clock selection module may provide a relatively high frequency clock to each of processor cores 730 and 740. If clock generator 105 determines that a phase error associated with the high frequency clock signal has exceeded a programmed threshold, clock generator 105 can assert signal TRIGGER(N), and control module 710 can respond by configuring clock selection module 720 to provide a clock signal operating at a relatively lower frequency.

Figure 8:
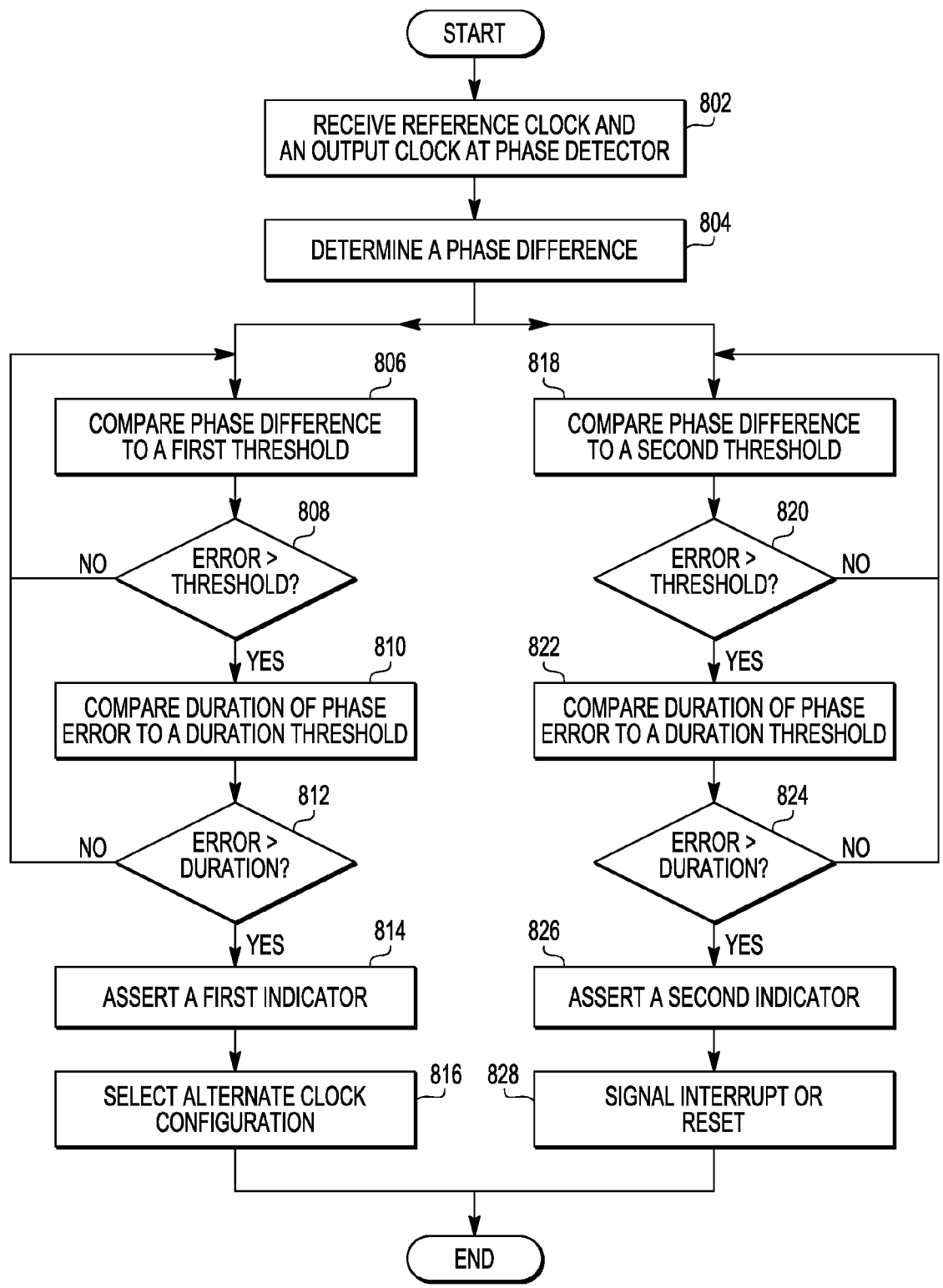
FIG. 8 is a flow diagram illustrating the operation of the clock generator and electronic device of FIG. 1 in accordance with a specific embodiment of the present disclosure.

FIG. 8 is a flow diagram 800 illustrating the operation of clock generator 105 and electronic device 100 of FIG. 1 in accordance with a specific embodiment of the present disclosure. Flow diagram 800 begins at block 802 where clock signal REFCLK and clock signal FEEDBACK re received at phase detector 1102 of phase locked loop 110 (FIG. 2). The flow proceeds to block 804 where phase detector 1102 determines a phase difference (phase error) between clock signal REFCLK and clock signal FEEDBACK, and provides signal UP and signal DOWN based on the phase difference. The flow proceeds in parallel to blocks 806 and 818. At block 806, compare module 130, and comparator 610 of FIG. 6 in particular, compares a digital representation of the preceding phase difference (signal PHASE ERROR) to a programmed threshold value represented by signal T1. At decision block 808, the flow proceeds to block 810 if the phase difference exceeds the threshold value. Otherwise, the flow returns to block 806 where a phase difference associated with a subsequent cycle of clock signal REFCLK is compared with programmed threshold value T1.

At block 810, comparator 630 (FIG. 6) compares the duration that signal PHASE ERROR exceeds threshold T1 to a programmed duration value represented by signal D1. At decision block 812, the flow proceeds to block 814 if the phase error has remained above the threshold for a time greater than the programmed duration value. Otherwise, the flow returns to block 806 where a phase difference associated with a subsequent cycle of clock signal REFCLK is compared with the programmed threshold value. At block 814, signal TRIGGER1 is asserted, and the flow proceeds to block 816 where select module 710 of FIG. 7 configures clock selection module 720 to provide an alternate clock source to processor core 730.

At block 818, compare module 130, and comparator 610 of FIG. 6 in particular, compares a digital representation of the preceding phase difference to another programmed threshold value represented by signal T2. At decision block 820, the flow proceeds to block 822 if the phase difference exceeds the threshold value. Otherwise, the flow returns to block 818 where a phase difference associated with a subsequent cycle of clock signal REFCLK is compared with programmed threshold value T2.

At block 822, comparator 630 FIG. 6 compares the duration that signal PHASE ERROR exceeds threshold T2 to a programmed duration value represented by signal D2. At decision block 824, the flow proceeds to block 826 if the phase error has remained above the threshold for a time greater than the programmed duration value. Otherwise, the flow returns to block 818 where a phase difference associated with a subsequent cycle of clock signal REFCLK is compared with the programmed threshold value. At block 826, signal TRIGGER2 is asserted, and the flow proceeds to block 828 where select module 710 of FIG. 7 asserts an interrupt signal to request that processor core 730 perform a corrective operation.

Any number of programmable threshold values and duration values can be implemented, and any number of responses can be asserted based on a phase error that exceeds a programmed threshold level or exceeds a programmed level and remains at that level for a programmed duration. The asserted response can be anticipatory and intended to prevent a functional failure based on determining that clock signal phase error is approaching a critical level. Alternatively, the asserted response can be reactionary and intended to provide remedy following a functional error.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, in an embodiment, divider 1108 is not included at phase locked loop 110, and clock signal CLOCK is provided directly to phase detector 1102 instead of clock signal FEEDBACK.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
   receiving a reference clock signal at a first phase lock loop;
   providing a first pulse via a first signal based on the reference clock signal and an output clock signal of the phase lock loop, a first pulse-width of the first pulse indicative of a first phase difference between the reference clock signal and the output clock signal;
   determining a first digital value based on the first pulse-width, wherein determining the first digital value comprises:
     delaying the first signal by a first delay to determine a first delayed signal;
     delaying the first signal by a second delay to determine a second delayed signal;
     storing a first asserted bit of a second digital value in response to determining the first signal and the first delayed signal are asserted at the same time; and
     determining the first digital value based on the second digital value, and based on a comparison of the second delayed signal with the first signal; and
   storing the first digital value.

2. The method of claim 1, wherein determining the first digital value further comprises:
   storing a second asserted bit of the second digital value in response to determining the first signal and the second delayed signal are asserted at the same time.

3. The method of claim 1, wherein determining the first digital value based on the second digital value comprises determining the first digital value based on a number of leading negated bits of the second digital value.

4. The method of claim 1, wherein determining the first digital value based on the second digital value comprises determining the first digital value based on a number of trailing asserted bits of the second digital value.

5. The method of claim 1, wherein the first phase difference is indicative of the phase difference between the reference clock signal and the output clock signal at a first time, and further comprising:
   providing a second pulse via the first signal, a second pulse-width of the second pulse indicative of a second phase difference between the reference clock signal and the output clock signal at a second time;
   determining a third digital value based on the second pulse-width; and
   storing the third digital value.

6. A method, comprising:
   receiving a reference clock signal at a first phase lock loop;
   in response to a first phase difference between the reference clock signal and an output clock signal of the phase lock loop being in a first range:

providing a first pulse via a first signal, a first pulse-width of the first pulse indicative of the first phase difference; and determining a first digital value based on the first pulse-width, wherein determining the first digital value based on the first pulse width comprises:

delaying the first signal by a first delay to determine a first delayed signal;

storing a first asserted bit of a second digital value in response to determining the first signal and the first delayed signal are asserted at the same time; and determining the first digital value based on the second digital value and based on a comparison of the first delayed signal with the first signal;

in response to the first phase difference between the reference clock signal and an output clock signal of the phase lock loop being in a second range:

providing a second pulse via a second signal, a second pulse-width of the second pulse indicative of the first phase difference; and determining a second digital value based on the second pulse-width; and storing the first digital value.

7. The method of claim 6, wherein determining the first digital value based on the second pulse width comprises:

delaying the second signal by the first delay to determine a second delayed signal; and determining the first digital value based on a comparison of the second delayed signal with the second signal.

8. A device, comprising:

a phase lock loop comprising an input configured to receive a reference clock signal, an output configured to provide an output clock signal based on the reference clock signal, and a phase detector comprising a first input to receive the reference clock signal, a second input to receive the output clock signal, and a first output to provide a first pulse having a first pulse-width indicative of a phase difference between the reference clock signal and the output clock signal; and a phase measurement module comprising;

a first input coupled to the first output of the phase detector;

a first delay module comprising an input coupled to the output of the phase detector;

a first flip-flop having a data input coupled to the output of the first delay module, a clock input coupled to the output of the phase detector, and an output; and an output to provide a first delayed pulse in response to receiving a pulse at the input of the first delay module; the phase measurement module configured to determine a first digital value based on the first pulse width.

9. The device of claim 8, wherein the first output of the phase detector is configured to provide the first pulse in response to the phase difference being in a first range, and wherein the phase detector further comprises:

a second output to provide a second pulse having a second pulse-width indicative of a phase difference between the reference clock signal and the output clock signal.

10. The device of claim 9, wherein the phase measurement module further comprises a second input coupled to the second output of the phase detector, the phase measurement module configured to determine a second digital value based on the second pulse width.

11. The device of claim 8, wherein the phase measurement module further comprises:

a second delay module comprising an input coupled to the output of the first delay module and an output to provide a second delayed pulse in response to receiving a pulse at the input; and a second flip-flop having a data input coupled to the output of the second delay module, a clock input coupled to the output of the phase detector, and an output.

12. The device of claim 11, further comprising:

a counter coupled to the output of the first flip-flop and coupled to the output of the second flip-flop, the counter configured to determine the first digital value.

13. The device of claim 12, wherein the counter is configured to determine the first digital value by determining a number of leading negated values of a second digital value, the second digital value based on information stored at the first flip-flop and the second flip-flop.

* * * * *